(12) United States Patent
Smilde et al.

(10) Patent No.: US 10,042,268 B2
(45) Date of Patent: Aug. 7, 2018

(54) METHOD, APPARATUS AND SUBSTRATES FOR LITHOGRAPHIC METROLOGY

(71) Applicant: ASML Netherlands B.V., Veldhoven (NL)

(72) Inventors: Hendrik Jan Hidde Smilde, Veldhoven (NL); Arie Jeffrey Den Boef, Veldhoven (NL); Omer Abubaker Omer Adam, Veldhoven (NL); Martin Jacobus Johan Jak, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 51 days.

(21) Appl. No.: 15/038,535

(22) PCT Filed: Nov. 4, 2014

(86) PCT No.: PCT/EP2014/073701
§ 371 (c)(1),
(2) Date: May 23, 2016

(87) PCT Pub. No.: WO2015/078669
PCT Pub. Date: Jun. 4, 2015

(65) Prior Publication Data
US 2016/0291481 A1 Oct. 6, 2016

(30) Foreign Application Priority Data
Nov. 26, 2013 (EP) .................................... 13194522

(51) Int. Cl.
*G01B 11/00* (2006.01)
*G03F 7/20* (2006.01)
(52) U.S. Cl.
CPC ............................. *G03F 7/70633* (2013.01)

(58) Field of Classification Search
CPC ............. G03F 7/70633; G03F 7/70683; G03F 9/7019; G01N 21/956; Y10T 428/24802
(Continued)

(56) References Cited

U.S. PATENT DOCUMENTS

| 6,911,287 B2 | 6/2005 | Cho |
|---|---|---|
| 7,333,200 B2 | 2/2008 | Sezginer et al. |

(Continued)

FOREIGN PATENT DOCUMENTS

| CN | 102967997 A | 3/2013 |
|---|---|---|
| JP | 2001-267211 A | 9/2001 |

(Continued)

OTHER PUBLICATIONS

English-language Machine Translation of Japanese Patent Publication No. JP 2007-527531 A, published Sep. 27, 2007; 68 pages.
(Continued)

*Primary Examiner* — Isiaka Akanbi
(74) *Attorney, Agent, or Firm* — Sterne, Kessler, Goldstein & Fox P.L.L.C.

(57) ABSTRACT

A substrate has three or more overlay gratings formed thereon by a lithographic process. Each overlay grating has a known overlay bias. The values of overlay bias include for example two values in a region centered on zero and two values in a region centered on P/2, where P is the pitch of the gratings. Overlay is calculated from asymmetry measurements for the gratings using knowledge of the different overlay bias values and an assumed non-linear relationship between overlay and target asymmetry, thereby to correct for feature asymmetry. The periodic relationship in the region of zero bias and P/2 has gradients of opposite sign. The calculation allows said gradients to have different magnitudes as well as opposite sign. The calculation also provides information on feature asymmetry and other processing (Continued)

effects. This information is used to improve subsequent performance of the measurement process, and/or the lithographic process.

20 Claims, 10 Drawing Sheets

(58) Field of Classification Search
USPC .................... 356/401–446, 237.2–237.6
See application file for complete search history.

(56) References Cited

U.S. PATENT DOCUMENTS

| | | | |
|---|---|---|---|
| 8,363,220 | B2 | 1/2013 | Coene et al. |
| 8,411,287 | B2 | 4/2013 | Smilde et al. |
| 2004/0169861 | A1* | 9/2004 | Mieher ............. G01N 21/956 356/400 |
| 2005/0012928 | A1* | 1/2005 | Sezginer ............. G01B 11/26 356/401 |
| 2006/0274310 | A1 | 12/2006 | Kandel et al. |
| 2007/0229837 | A1 | 10/2007 | Schaar et al. |
| 2010/0277706 | A1* | 11/2010 | Van der Schaar .. G03F 7/70633 355/53 |
| 2010/0284008 | A1 | 11/2010 | Coene et al. |
| 2011/0020616 | A1 | 1/2011 | Coene et al. |
| 2011/0027704 | A1 | 2/2011 | Cramer et al. |
| 2011/0043791 | A1 | 2/2011 | Smilde et al. |
| 2012/0044470 | A1 | 2/2012 | Smilde et al. |
| 2012/0123581 | A1 | 5/2012 | Smilde et al. |
| 2012/0227014 | A1 | 9/2012 | Pforr |
| 2012/0242970 | A1 | 9/2012 | Smilde et al. |
| 2013/0054186 | A1 | 2/2013 | Den Boef |
| 2013/0258310 | A1 | 10/2013 | Smilde et al. |

FOREIGN PATENT DOCUMENTS

| | | |
|---|---|---|
| JP | 2007-527531 A | 9/2007 |
| JP | 2008-542790 A | 11/2008 |
| KR | 1020030039599 A | 5/2003 |
| TW | 201226891 A | 7/2012 |
| TW | 201229496 A | 7/2012 |
| WO | WO 2009/078708 A1 | 6/2009 |
| WO | WO 2009/106279 A1 | 9/2009 |
| WO | WO 2011/012624 A1 | 2/2011 |
| WO | WO 2013/143814 A1 | 10/2013 |
| WO | WO 2014/005828 A1 | 1/2014 |

OTHER PUBLICATIONS

Attota, et al., "Evaluation of New In-chip and Arrayed Line Overlay Target Designs," Metrology, Inspection, and Process Control for Microlithography, SPIE, vol. 5375, 2004; pp. 395-402.

International Search Report and Written Opinion of the International Search Authority directed to related International Patent Application No. PCT/EP2014/073701, dated Jan. 29, 2015; 11 pages.

International Preliminary Report on Patentability directed to related International Patent Application No. PCT/EP2014/073701, dated May 31, 2016; 9 pages.

* cited by examiner

METHOD, APPARATUS AND SUBSTRATES FOR LITHOGRAPHIC METROLOGY

CROSS-REFERENCE TO RELATED APPLICATIONS

This application claims the benefit of EP application 13194522, which was filed on Nov. 26, 2013 and which is incorporated herein in its entirety by reference.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Multiple targets can be measured in one image.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating, and asymmetry in an overlay grating can be used as an indicator of overlay error.

Although the known dark-field image-based overlay measurements are fast and computationally very simple (once calibrated), they rely on an assumption that overlay is the only cause of asymmetry in the target structure. Any other asymmetry in the stack, such as asymmetry of features within one or both of the overlaid gratings, also causes an asymmetry in the $1^{st}$ orders. This asymmetry which is not related to the overlay clearly perturbs the overlay measurement, giving an inaccurate overlay result. Asymmetry in the bottom grating of the overlay grating is a common form of feature asymmetry. It may originate for example in wafer processing steps such as chemical-mechanical polishing (CMP), performed after the bottom grating was originally formed.

Accordingly at this time the skilled person has to choose between, on the one hand, a simple and fast measurement process that gives overlay measurements but is subject to inaccuracies when other causes of asymmetry are present, and on the other hand more traditional techniques that are computationally intensive and typically require several measurements of large, underfilled gratings to avoid the pupil image is polluted with signal from the environment of the overlay grating, which hampers the reconstruction on this.

Therefore, it is desired to distinguish the contributions to target structure asymmetry that are caused by overlay and other effects in a more direct and simple way.

SUMMARY OF THE INVENTION

It is desirable to provide a method and apparatus for overlay metrology using target structures, in which throughput and accuracy can be improved over prior published techniques. Furthermore, although the invention is not limited to this, it would be of great advantage, if this could be applied to small target structures that can be read out with the dark-field image-based technique.

The invention in a first aspect provides method of measuring a parameter of a lithographic process, the method comprising the steps of:
(a) providing a plurality of target structures on a substrate, each target structure comprising overlaid periodic structures and each having a known overlay bias;
(b) illuminating the targets and detecting radiation scattered by each target structure to obtain for that target structure a measurement representing an overall asymmetry that includes contributions due to (i) said known overlay bias, (ii) overlay performance of a lithographic process used to form the target structures and (iii) feature asymmetry within one or more of said periodic structures;

(c) using said overall asymmetry measurements for three or more target structures to calculate a measurement of said overlay error, said calculation being performed using the known overlay bias values and an assumed non-linear periodic relationship between overlay error and asymmetry, thereby to exclude the contribution due to feature asymmetry, wherein the known values of overlay bias for said three or more target structures include at least two values falling within a first region of said periodic relationship and at least one value falling within a second region of said periodic relationship, the periodic relationship in the first and second regions having gradients of opposite sign.

In disclosed embodiments, the first region of said periodic relationship is a half period centered on zero bias and the second region is a half period centered on P/2 where P is the pitch of the periodic relationship.

In some disclosed embodiments, four or more different values of overlay bias are used and include at least two bias values within each of said first and second regions of the periodic relationship. The calculation in that case may be performed while allowing said gradient to have different magnitudes in the first and second regions of the periodic relationship. This can give an overlay measurement that is more robust against certain types of process-induced asymmetry in the targets.

The calculation may deliver other performance parameters that may be used to control the performance of step (c) and/or the performance of lithographic process on other substrates.

The invention further provides an inspection apparatus for measuring a parameter of a lithographic process, the apparatus comprising:

a support for a substrate having a plurality of target structures thereon, each target structure comprising overlaid periodic structures and each having a known overlay bias;

an optical system for illuminating the targets and detecting radiation scattered by each target structure to obtain for that target structure a measurement representing an overall asymmetry that includes contributions due to (i) said known overlay bias, (ii) overlay performance of said lithographic process and (iii) feature asymmetry within one or more of said periodic structures;

a processor arranged to use said overall asymmetry measurements for three or more target structures having three or more different values of overlay bias to calculate a measurement of overlay performance, said calculation being performed using the known overlay bias values and an assumed non-linear relationship between overlay and target asymmetry, thereby to exclude the contribution due to feature asymmetry wherein the known values of overlay bias for said three or more target structures include at least two values falling within a first region of said periodic relationship and at least one value falling within a second region of said periodic relationship, the periodic relationship in the first and second regions having gradients of opposite sign.

The invention yet further provides a substrate for use in a method or apparatus according to the invention as set forth above, the substrate having a plurality of target structures formed thereon by a lithographic process, each target structure comprising overlaid periodic structures and each having a specific overlay bias, wherein the values of overlay bias for said three or more target structures include at least two values falling within a half period centered on zero bias and at least one value falling within a half period centered on P/2 where P is a period of said periodic structures.

In one embodiment at least four target structures are provided and wherein the values of overlay bias for said three or more target structures include at least two values falling within a half period centered on zero bias and at least two values falling within a half period centered on P/2 where P is a period of said periodic structures.

The invention yet further provides a pair of patterning devices for use in forming a substrate according to any aspect of the invention as set forth above, the patterning devices together being adapted for use in forming said target structures with at least three overlay biases.

The invention yet further provides a computer program product comprising machine-readable instructions for causing a processor to perform the processing step (c) of a method according to the invention as set forth above.

The invention yet further provides a lithographic system comprising:

a lithographic apparatus arranged to transfer a sequence of patterns from patterning devices onto a substrate in an overlying manner; and an inspection apparatus according to the invention as set forth above, wherein the lithographic apparatus is arranged to use one or more parameters calculated by the inspection apparatus in applying said sequence of patterns to further substrates.

The invention yet further provides a method of manufacturing devices wherein a sequence of device patterns is applied to a series of substrates using a lithographic process, the method including inspecting at least one periodic structure formed as part of or beside said device pattern on at least one of said substrates using a method according to the invention as set forth above, and controlling the lithographic process for later substrates in accordance with one of more parameters calculated in step (c) of the method.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
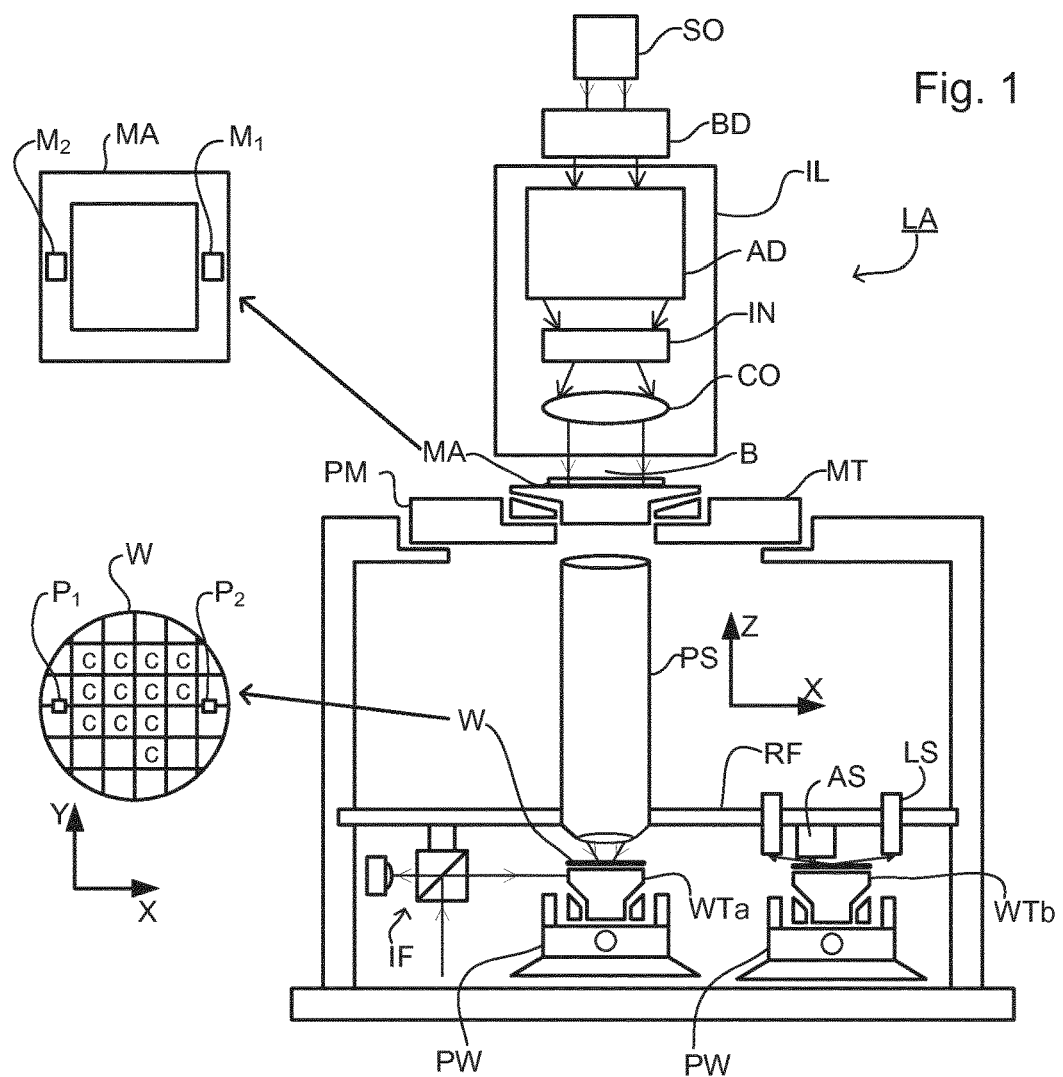
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
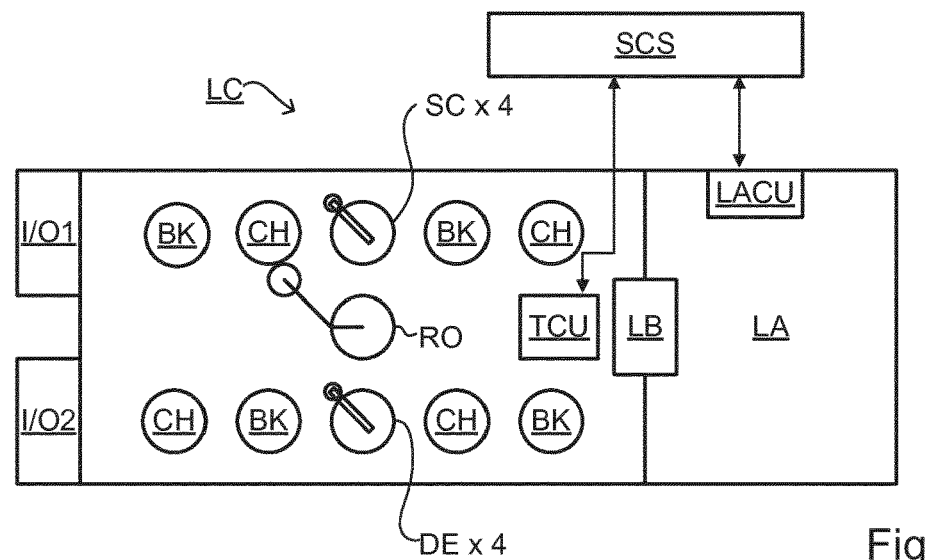
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3A:
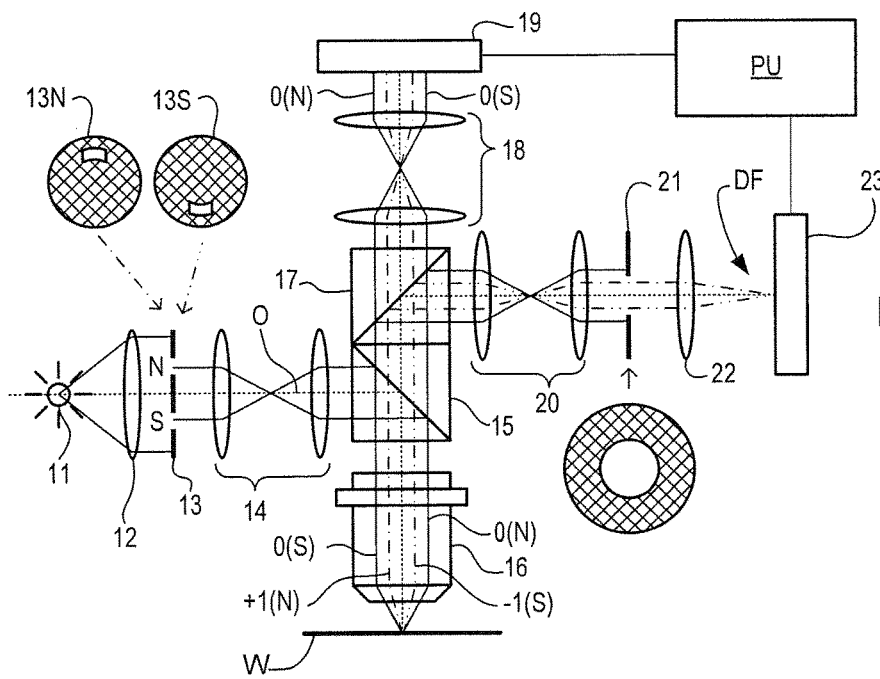
FIGS. 3(a)-3(d) comprise (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures.

A dark field metrology apparatus suitable for use in embodiments of the invention is shown in FIG. 3(a). A target grating T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figures 3B, 3C, 3D:
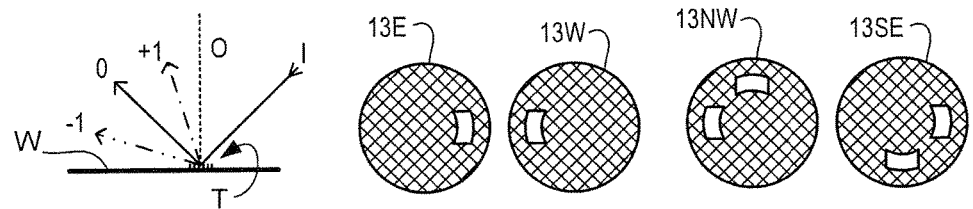

As shown in FIG. 3(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

Figure 4:
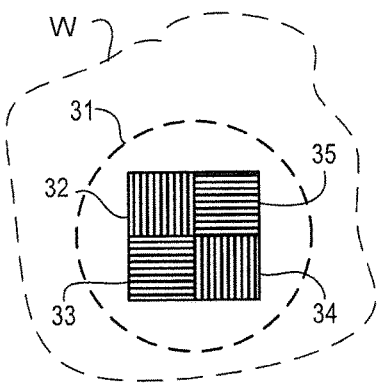
FIG. 4 depicts a known form of multiple grating target and an outline of a measurement spot on a substrate.

FIG. 4 depicts a composite target formed on a substrate according to known practice. The composite target comprises four gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. The meaning of overlay bias will be explained below with reference to FIG. 7. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23.

Figure 5:
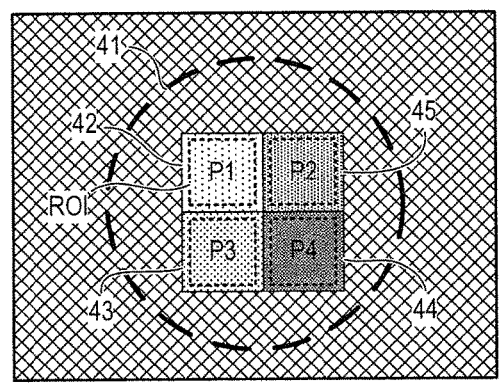
FIG. 5 depicts an image of the target of FIG. 4 obtained in the scatterometer of FIG. 3.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
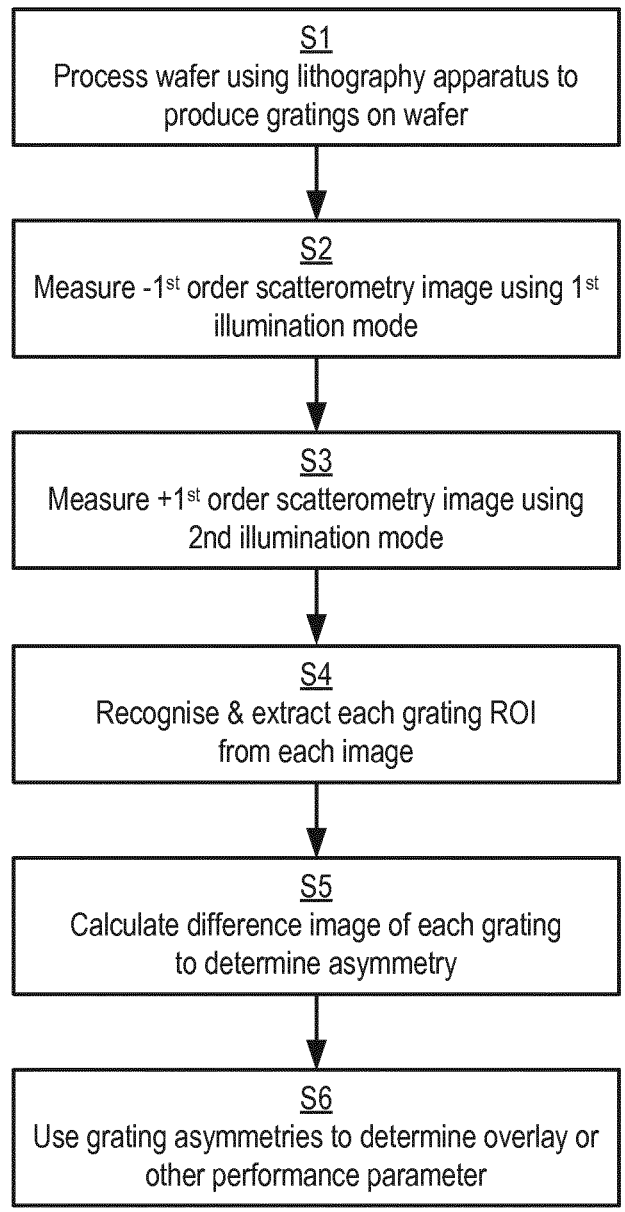
FIG. 6 is a flowchart showing the steps of an overlay measurement method using the scatterometer of FIG. 3 and adaptable to form embodiments of the present invention.

FIG. 6 illustrates how, using for example the method described in application WO 2011/012624, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including the overlay targets 32-35. At S2, using the metrology apparatus of FIG. 3, an image of the gratings 32 to 35 is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image.

Note that, by including only half of the first order diffracted radiation in each image, the 'images' referred to here are not conventional dark field microscopy images. The individual grating lines will not be resolved. Each grating will be represented simply by an area of a certain intensity level. In step S4, a region of interest (ROI) is identified within the image of each component grating, from which intensity levels will be measured.

Having identified the ROI for each individual grating and measured its intensity, the asymmetry of the grating structure, and hence overlay error, can then be determined. This is done by the image processor and controller PU in step S5 comparing the intensity values obtained for +1 and −1 orders for each grating 32-35 to identify any difference in their intensity. The term "difference" is not intended to refer only to subtraction. Differences may be calculated in ratio form. In step S6 the measured asymmetries for a number of gratings are used together with knowledge of the overlay biases of those gratings to calculate one or more performance parameters of the lithographic process in the vicinity of the target T. A performance parameter of great interest is overlay. As will be described later, the novel methods also allow other parameters of performance of the lithographic process to be calculated. These can be fed back for improvement of the lithographic process, and/or used to improve the measurement and calculation process of FIG. 6 itself.

In the prior applications, mentioned above, various techniques are disclosed for improving the quality of overlay measurements using the basic method mentioned above. These techniques will not be explained here in further detail. They may be used in combination with the techniques newly disclosed in the present application, which will now be described.

FIG. 7 shows schematic cross sections of overlay gratings, with different biases. These can be used as the target T on substrate W, as seen in FIGS. 3 and 4. Gratings with periodicity in the X direction are shown for the sake of example only. Different combinations of these gratings with different biases and with different orientations can be provided separately or as part of a composite target.

Figure 7A:
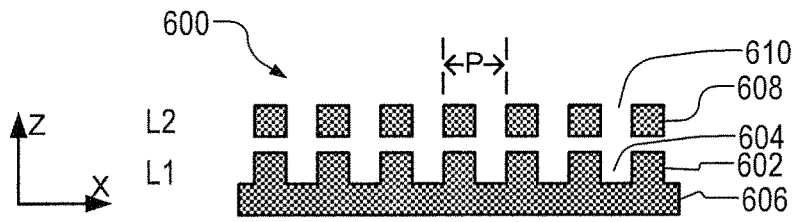
FIGS. 7(a)-7(c) show schematic cross-sections of overlay gratings having different overlay values in the region of zero.

Starting with FIG. 7(a) we see an overlay grating 600 formed in two layers, labeled L1 and L2. In the bottom layer L1, a grating is formed by lines 602 and spaces 604 on a substrate 606. In layer L2 a second grating is formed by lines 608 and spaces 610. (The cross-section is drawn such that the lines 602, 608 extend into the page.) The grating pattern repeats with a pitch P in both layers. Lines 602 and 608 are mentioned for the sake of example only, other types of features such as dots, blocks and via holes can all be used. In the situation shown at (a), there is no overlay error and no bias, so that each mark 608 lies exactly over a mark 602 in the bottom grating.

At (b), we see the same target with a bias +d, such that the marks 608 of the upper grating are shifted by an distance d to the right, relative to the marks of the bottom grating. The bias distance d might be a few nanometers in practice, for example 10 nm 20 nm, while the pitch P is for example in the range 300-1000 nm, for example 500 nm or 600 nm. At (c) we see another mark with a bias −d, such that the marks of 608 are shifted to the left. Biased targets of this type shown at (a) to (c) are well known in the art, and used in the prior applications mentioned above.

Figure 7B:
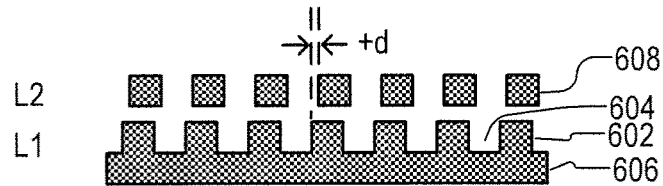
Figure 7C:
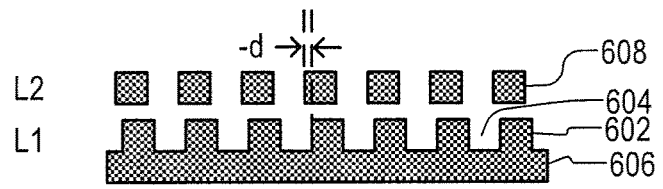
Figure 7D:
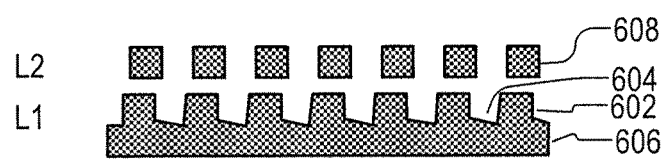
FIG. 7 (d) is a schematic cross-section of an overlay grating having feature asymmetry in a bottom grating due to processing effects.
FIGS. 7(e)-7(g) show schematic cross-sections of overlay gratings having different bias values in the region of a half pitch, as used in embodiments of the present invention.

FIG. 7(d) shows schematically a phenomenon of bottom grating asymmetry. The features in the gratings at (a) to (c), are shown as perfectly square-sided, when a real feature would have some slope on the side, and a certain roughness. Nevertheless they are intended to be at least symmetrical in profile. The marks 602 and/or spaces 604 at (d) in the bottom grating no longer have a symmetrical form at all, but rather have become distorted by processing steps. Thus, for example, a bottom surface of each space has become tilted. Side wall angles of the lines and spaces have become asymmetrical also. When overlay is measured by the method of FIG. 6 using only two biased gratings, the process-induced asymmetry cannot be distinguished from overlay, and overlay measurements become unreliable as a result.

In WO 2013143814 A1, mentioned above, we proposed the use of three or more component gratings to measure overlay by a modified version of the method of FIG. 6. Using three or more gratings of the type shown in FIGS. 7(a) to (c) are used to obtain overlay measurements that are to some extent corrected for feature asymmetry in the target gratings, such as is caused by bottom grating asymmetry in a practical lithographic process. However, if signals are noisy, it becomes difficult to make this correction. Furthermore, if a periodic relationship that is used as the basis of the calculation does not accurately model higher order harmonics present in the real target, additional errors will occur in the overlay measurement result.

Figure 7E:
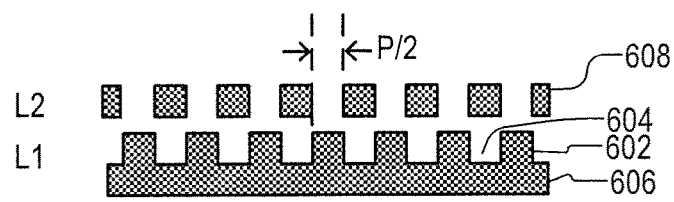
Figure 7F:
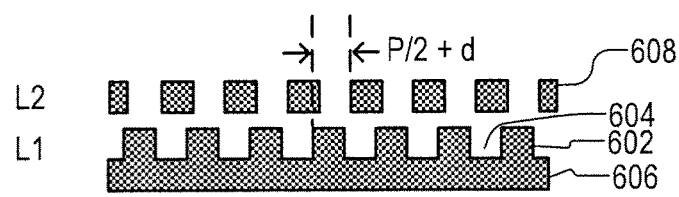
Figure 7G:
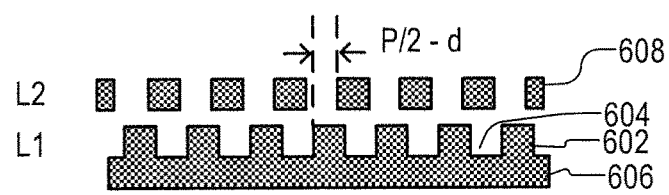

FIG. 7(e) shows a mark with a programmed bias of P/2, that is half the pitch, such that each line 608 in the upper grating lies exactly over a space 604 in the lower grating. At (f), we see a similar grating, but with a small bias to the right (+d) added to the P/2 bias. At (g) we see a similar mark but with a bias to the left (−d) added to the bias P/2. Overlay gratings with bias in the region of P/2 are in themselves known. They are sometimes referred to as "line on trench" targets, while gratings with bias in the region of zero are referred to as "line on line" targets.

Figure 8:
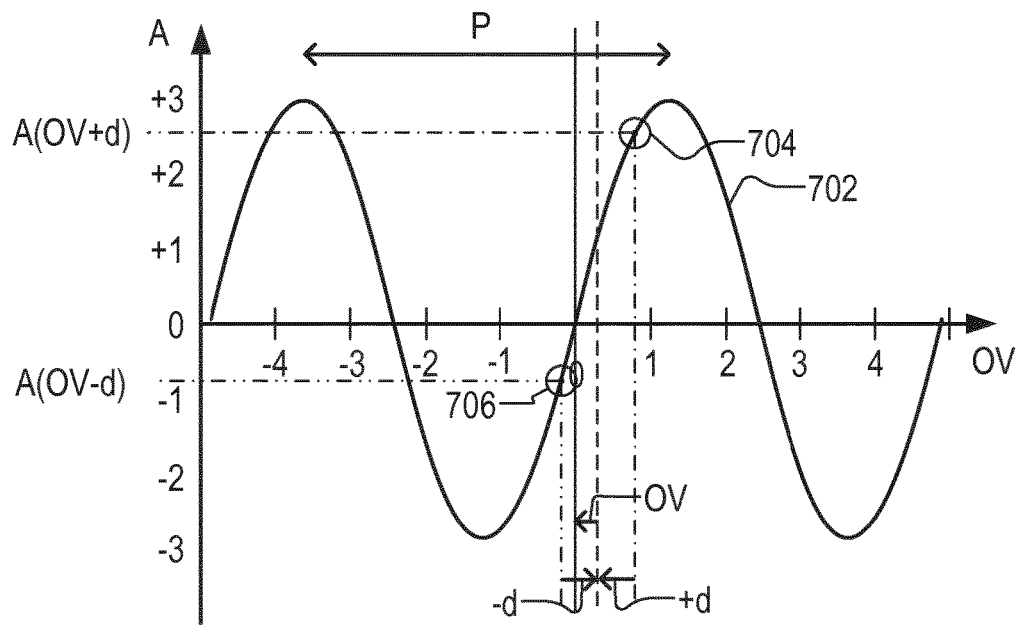
FIG. 8 illustrates known principles of overlay measurement in an ideal target structure, not subject to feature asymmetry.
Figure 9:
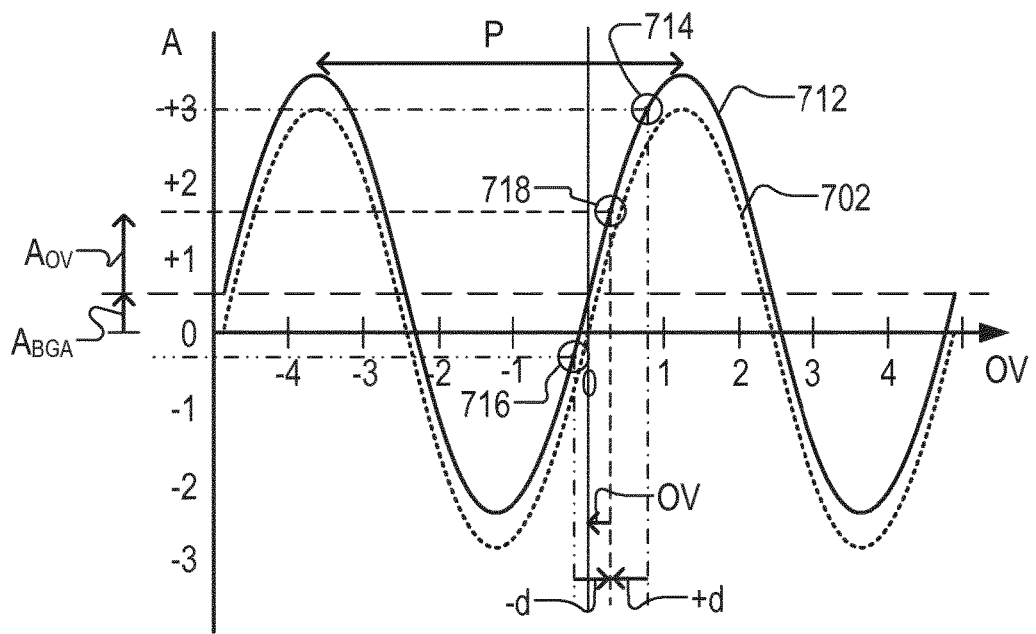
FIG. 9 illustrates a known principle of overlay measurement in a non-ideal target structure, with correction of feature asymmetry as disclosed in WO 2013143814 A1.

In the Embodiments of the invention to be described below use in addition one or more of the P/2 biased gratings as shown at (e), (f) and (g), to improve the robustness of the overlay measurement against a process-induced asymmetry, with greater noise immunity than the known techniques. Particular embodiments of the invention are further robust against higher-order harmonics in the periodic relationship between measured asymmetry and overlay error in the target. FIGS. 8 and 9 will be used to explain the prior techniques, and then FIG. 10 onward will show the techniques disclosed herein.

In FIG. 8 a curve 702 illustrates the relationship between overlay error OV and measured asymmetry A for an 'ideal' target having zero offset and no feature asymmetry within the individual gratings forming the overlay grating. These graphs are to illustrate the principles of the invention only, and in each graph, the units of measured asymmetry A and overlay error OV are arbitrary. Examples of actual dimensions will be given further below.

In the 'ideal' situation of FIG. 7, the curve 702 indicates that the measured asymmetry A has a sinusoidal relationship with the overlay. The period P of the sinusoidal variation corresponds to the period (pitch) of the gratings, converted of course to an appropriate scale. The sinusoidal form is pure in this example, but can include harmonics in real circumstances. For the sake of simplicity, it is assumed in this example (a) that only first order diffracted radiation from the targets reaches the image sensor 23 (or its equivalent in a given embodiment), and (b) that the experimental target design is such that within these first orders a pure sine-relation exists between intensity and overlay between top and bottom grating results. Whether this is true in practice is a function of the optical system design, the wavelength of the illuminating radiation and the pitch P of the grating, and the design and stack of the target. In an embodiment where $2^{nd}$, $3^{rd}$ or higher orders also contribute to the intensities measured by sensor 23, the novel techniques to be described will help obtain an accurate overlay measurement.

As mentioned above, biased gratings can be used to measure overlay, rather than relying on a single measurement. This bias has a known value defined in the patterning device (e.g. a reticle) from which it was made, that serves as an on-wafer calibration of the overlay corresponding to the measured signal. In the drawing, the calculation is illustrated graphically. In steps S1-S5, asymmetry measurements A(+d) and A(−d) are obtained for component gratings having biases +d an −d respectively (as shown in FIGS. 7(b) and (c), for example). Fitting these measurements to the sinusoidal curve gives points 704 and 706 as shown. Knowing the biases, the true overlay error OV can be calculated. The pitch P of the sinusoidal curve is known from the design of the target. The vertical scale of the curve 702 is not known to start with, but is an unknown factor which we can call a $1^{st}$ harmonic proportionality constant, $K_1$.

In equation terms, the relationship between overlay and asymmetry is assumed to be:

$$A = K_1 \cdot \sin(OV)$$

where OV is expressed on a scale such that the grating pitch P corresponds to an angle $2\pi$ radians. Using two measurements with of gratings with different, known biases one can solve two equations to calculate the unknowns $K_1$ and overlay OV.

FIG. 9 (taken from WO 2013143814 A1) shows a first effect of introducing feature asymmetry, for example the bottom grating asymmetry illustrated in FIG. 7 (d). The 'ideal' sinusoidal curve 702 no longer applies. However, at least approximately, bottom grating asymmetry or other feature asymmetry has the effect of adding an offset to the asymmetry value A, which is relatively constant across all overlay values. The resulting curve is shown as 712 in the diagram, with label $A_{BGA}$ indicating the offset due to feature asymmetry. In equation terms, the relationship used for calculation in step S6 becomes:

$$A = K_0 + K_1 \cdot \sin(OV)$$

By providing multiple gratings with a biasing scheme having three or more different bias values, the prior application seeks to obtain accurate overlay measurements by fitting the measurements to the off-set sine curve 712 and eliminating the constant.

Detailed examples of the modified measurement and calculations are given in the prior application for various different biasing schemes. For a simple example to illustrate the principle, FIG. 9 shows three measurement points 714, 716 and 718 fitted to the curve 712. The points 714 and 716 are measured from gratings having bias +d and −d, the same as for the points 704 and 706 in FIG. 7. A third asymmetry measurement from a grating with zero bias (in this example) is plotted at 718. Fitting the curve to three points allows the constant asymmetry value $A_{BGA}$ that is due to feature asymmetry to be separated from the sinusoidal contribution $A_{OV}$ that is due to overlay error, so that the overlay error can be calculated more accurately.

As noted already, the overlay calculations of modified step S6 rely on certain assumptions. Firstly, it is assumed that $1^{st}$ order intensity asymmetry due to the feature asymmetry (for example BGA) is independent of the overlay for the overlay range of interest, and as a result it can be described by a constant offset $K_0$. Another assumption is that intensity asymmetry behaves as a sine function of the overlay, with the period P corresponding to the grating pitch. The number of harmonics can be designed to be small, because the small pitch-wavelength ratio only allows for a small number of propagating diffraction orders from the grating. However, in practice the overlay contribution to the intensity-asymmetry may not be only sinusoidal, and may not be symmetrical about OV=0.

There will now be described novel composite target designs that can include three, but also for example four gratings. Each example shows a proposed composite target layout. Each composite target layout comprises a plurality of component gratings, each forming one of the target structures referred to in the introduction and claims. Compared to the bias schemes of known targets, the novel targets are distinguished by having gratings biases in the region of P/2, as well as in the region of zero. Referring to FIG. 7, the novel targets comprise at least three gratings, including at least one chosen from the line-on-line forms (a) to (c) and at least one chosen from the line-on-trench forms (e) to (g).

Figure 10:
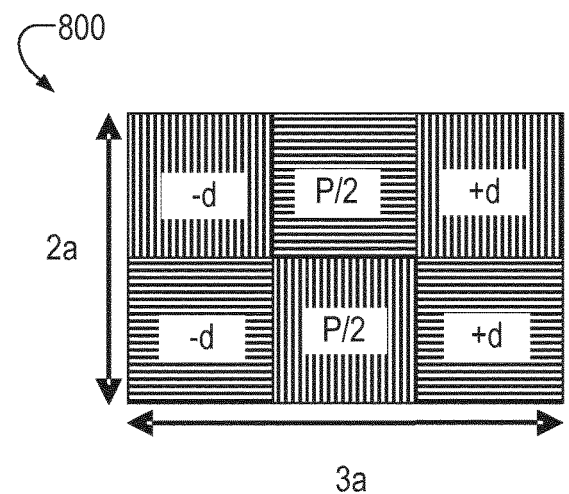
FIG. 10 illustrates a composite grating target having a bias scheme according to a first embodiment of the present invention.

FIG. 10 shows a first example target 800 which can be used to implement overlay measurement with improved noise immunity. To solve for the overlay, at least three gratings are again required, because of the three unknowns: $K_0$, $K_1$, and overlay. The target of FIG. 10 has three gratings periodic in X and three gratings periodic in Y, so that overlay in both directions can be measured. In this example, the biases are not all centered on zero overlay as they were in the prior application. Rather there are two biases (+d and −d) centered around zero and a third bias that is at P/2. In terms of FIG. 7, the component gratings have the forms (b), (c) and (e). The target could also be formed with a third grating of the form (f) or (g).

Figure 11:
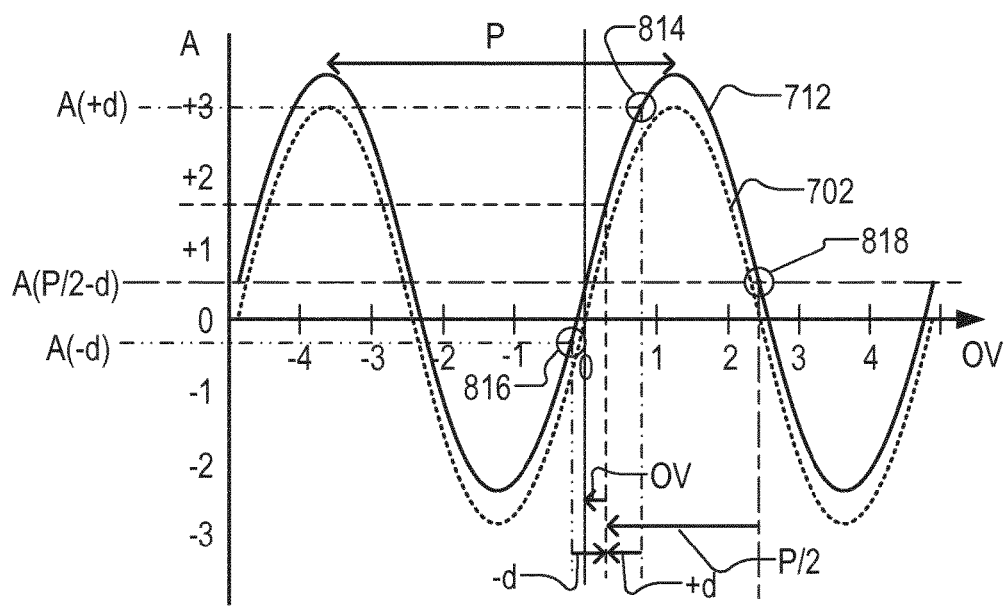
FIG. 11 illustrates principles of overlay measurement with correction of feature asymmetry using the target of FIG. 10.

FIG. 11 illustrates graphically relationship between the new bias scheme of FIG. 10 and the periodic relationship between overlay and asymmetry. As before, feature asymmetry (BGA) introduces an (unknown) vertical shift term $K_0$, giving curve 712. Referring again to the equation $$A = K_0 + K_1 \cdot \sin(OV)$$

asymmetry measurements A(+d), A(−d) and A(P/2) taken from the gratings can be used to solve for $K_0$, $K_1$ and OV. The measurements are plotted at 814, 816 and 818 respectively in FIG. 11. These points define the curve 712 more robustly than the points 714-718 in FIG. 9. Consequently the accuracy of the overlay measurement in this case is more robust than with the bias scheme of FIG. 9. However, the model is still based on the assumption that the periodic relationship is symmetrical, such that he absolute value of the slope is different at P/2 from what it is around 0. As a consequence, if the true relationship is not symmetrical due to certain higher harmonic components, the overlay result will be inaccurate.

Figure 12:
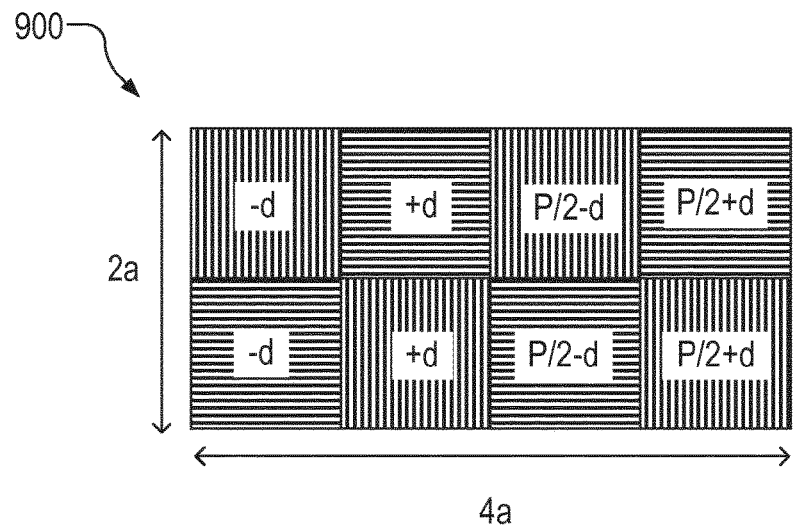
FIG. 12 illustrates a composite grating target having a bias scheme according to a second embodiment of the present invention.

FIG. 12 shows a second example target 900 which can be used to implement overlay measurement with improved noise immunity and also in the case where higher harmonics are present in the real periodic relationship. The target of FIG. 10 has four gratings periodic in X and four gratings periodic in Y, so that overlay in both directions can be measured. In this example, the biases are not all centered on zero overlay as they were in the prior application. Rather there are zero and two biases (P/2+d and P/2−d) centered around the half pitch P/2. In terms of FIG. 7, the component gratings are in two pairs, having the forms (b), (c) and (f), (g).

As will be appreciated, four biases gives the potential to solve equations in four unknowns. The particular selection of four biases can be in a particular modified version of step S6, to obtain overlay measurements that are robust against not only noise but also higher harmonics.

Figure 13:
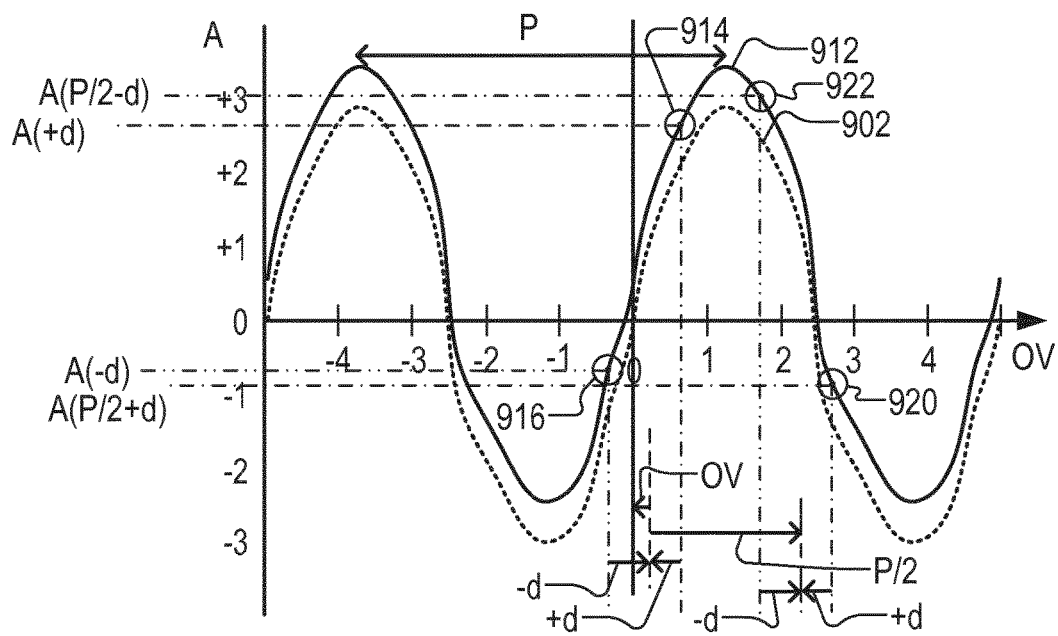
FIG. 13 illustrates principles of overlay measurement with correction of feature asymmetry and model error caused by higher-order harmonics using the target of FIG. 12.

FIG. 13 illustrates graphically relationship between the new bias scheme of FIG. 12 and the periodic relationship between overlay and asymmetry. To illustrate schematically the presence of higher harmonics, the periodic relationship between overlay OV and observed asymmetry A is represented by a curve 902 that is not a pure sine. Moreover, curve 902 is no longer symmetric about OV=0. As before, feature asymmetry (BGA) introduces an (unknown) vertical shift term $K_0$, giving curve 912. Asymmetry measurements A(+d), A(−d), A(P/2+d) and A(P/2+d) are taken from the gratings. The measurements are plotted at 914, 916, 920 and 922 respectively in FIG. 13.

Rather than using the four points to solve for three unknowns using a single sinusoidal equation as in the prior application, step S6 in the method of this example solves for four unknowns. This can be arranged in a variety of ways. In the present example, the calculation is performed so that the value of $K_1$ in the above equations is no longer assumed to the same globally, but is allowed to differ locally in the region of OV=0 and locally in the region of OV=P/2. This can be represented by two equations:

$$\begin{cases} A = K_0 + K_1' \cdot \sin(OV), & OV \sim 0 \\ A = K_0 + K_1'' \cdot \sin(OV), & OV \sim P/2 \end{cases}$$

with the effect that $K_1$ is no longer constrained to take a single value but has a value $K_1'$ in the region where overlay is near zero and $K_1''$ in the region where overlay is near a half pitch P/2. Effectively, where the prior model assumed that the slope of the curve 702 in the region of OV=0 must be of opposite sign by equal in magnitude in the region of OV=P/2, the new model allows the slope in these regions to be equal or unequal in magnitude.

Combining this new model with a target that contains gratings with two or more bias values in each region, the equations can be solved for $K_1'$ using the asymmetry measurements A(+d), A(−d), and solved for $K_1''$ using the pair A(P/2+d) and A(P/2+d). Because of the additional degree of freedom in the model, the accuracy of the overlay measurement in this case is more robust than with the bias scheme of FIG. 9, not only in respect of noise, but also when the true relationship contains higher harmonic components. In a case where the structure does not contain significant harmonics, the accuracy of the FIG. 10/11 method will be the same as that of the FIG. 12/13 method.

The provision of additional gratings bias increases the size of the targets and the number of measurements to be made. In terms of size, each composite target 800. 900 has component gratings with a basic dimension a transverse to the direction of periodicity, so that the composite target as a whole has overall dimension 3a, 2a etc. as shown. A composite grating target combining both X- and Y-direction gratings can be provided, as shown, or separate targets can be provided for X and Y directions. Purely as examples for illustration, the targets have dimensions of a=4 μm or 5 μm. Such targets can all be read out for overlay also with the dark-field image-based technique known from the previous patent applications mentioned above and illustrated in FIGS. 4 and 5. This enables BGA-corrected overlay at small targets without stack-reconstruction. The calculations of modified step S6 do not need to be illustrated in detail for the skilled person. Although it is convenient for the calculation to use bias values that are symmetrical about OV=0 or OV=P/2, the bias schemes illustrated are not the only ones possible. The magnitude of the bias d chosen to suit the situation. In example embodiments, the different overlay bias values within each region span a range greater than 1%, 2% or 5% of a pitch of said periodic structures (i.e. 2d/P>0.01, 0.02 or 0.05).

The calculation can be performed with any bias values, provided they are known in advance. The distinction between bias and sub-bias values is a matter of convenient notation. The biases for four gratings can be rewritten as $d_1$, $d_2$, $d_3$, $d_4$ whether they have values +d, −d, P/2+d and P/2−d or some other values. More than two measurements can be made in each region, if desired. The prior application WO 2013143814 A1 shows how four gratings can be applied to solve for three variables.

In the example targets illustrated, X and Y gratings with each bias value are side-by-side, though that is not essential. The X and Y gratings are interspersed with one another in an alternating pattern, so that different X gratings are diagonally spaced, not side-by-side with one another, and Y gratings are diagonally spaced, not side-by-side with one another. This arrangement may help to reduce cross-talk between diffraction signals of the different biased gratings. The whole arrangement thus allows a compact target design, without good performance. While the component gratings in FIGS. 10 and 12 are each square, composite grating targets with X and Y component gratings can also be made with elongate gratings. Examples are described for example in published patent application US20120044470.

Results & Applications

Using the novel targets and calculations disclosed herein, overlay measurements can be made that are significantly more robust to undesired asymmetries in the overlay metrology target, e.g. from wafer processing, while conserving the higher-harmonic robustness of the current 2-bias target design. The methods can be used at manufacturing sites using existing metrology apparatus and no any sensor hardware change. Creating the target is also simple. Compared with a current target illustrated in FIG. 4, target 900 for example can be made with no change in target design, only a second target is added with current design but with an additional bias of half-a-pitch. By choice, this additional target can be added for example only for processing-sensitive layers.

Figure 14A:
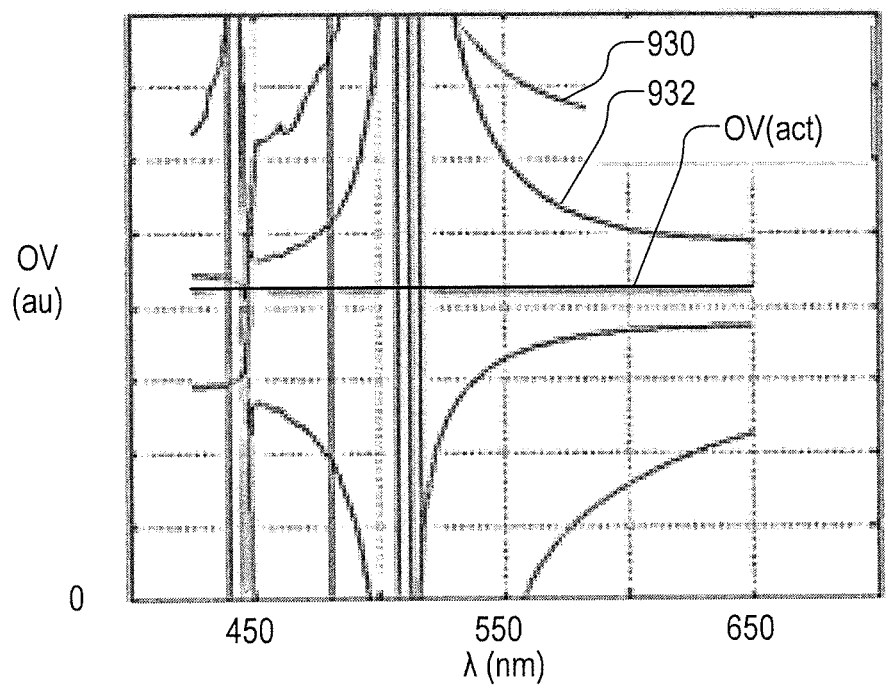
FIGS. 14(a) and 14(b) show simulated performance of (a) a known method and (b) a method using the target of FIG. 12 and the principles of FIG. 13.
Figure 14B:
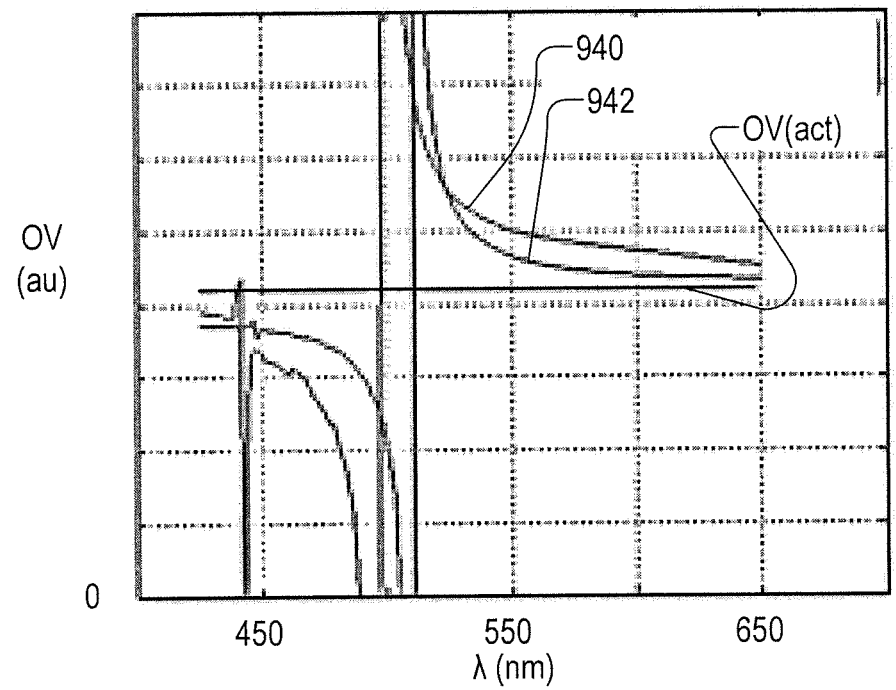

FIG. 14 shows two graphs comparing simulated performance of the overlay measurement (a) for 2-bias targets and (b) 4-bias targets of the type shown in FIGS. 12 and 13. In each graph, the horizontal axis is wavelength of the illuminating radiation in nanometers. A real instrument may provide a few wavelengths to be selected from. The vertical axis shows overlay OV. A line OV(act) marks the actual overlay of the simulated target. Curves 930, 932 and others show the overlay, as calculated in step S6, using different polarizations of radiation, and different types of marks. The simulation includes floor tilt in the bottom grating, as an example of process-induced feature asymmetry. As can be seen, the calculated value at most wavelengths is quite far from the actual overlay OV(act). Moreover, the calculated overlay depends very heavily on the wavelength and polarization, so that selection of measurement recipe is therefore critical.

By contrast, the graphs at (b) show that the calculated overlay values 940, 942 are very close to the actual overlay value OV(act) over a range of wavelength and polarizations. Therefore not only is the new method more accurate when the correct recipe is chose, but recipe selection is easier and less critical.

Figure 15:
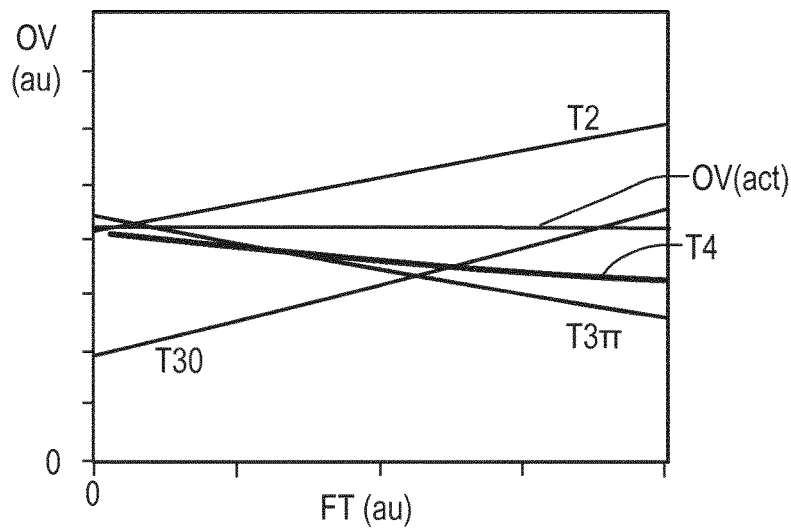
FIG. 15 illustrates performance of different methods in the presence of increasing feature asymmetry.

FIG. 15 shows the performance of various bias schemes, as the feature asymmetry varies. The horizontal axis in this case represents floor tilt FT in arbitrary units. The actual overlay is again marked OV(act). The curve T2 shows the overlay calculated by the current 2-bias scheme, while the curve T30 shows overlay calculated by the bias scheme of the prior application WO 2013143814 A1. In both of these known schemes, it can be seen how the calculated overlay is highly influenced by feature asymmetry. The curve T30 is particularly affected by higher harmonics in the asymmetry. Curve T3$\pi$ shows overlay calculated using the 3-bias scheme of FIGS. 10 and 11, while curve T4 shows overlay calculated using the 4-bias scheme of FIGS. 12 and 13. It can be seen that both measurements are accurate when feature asymmetry is low, while the 4-bias method maintains accuracy better as the feature asymmetry (floor tilt) increases.

Figure 16:
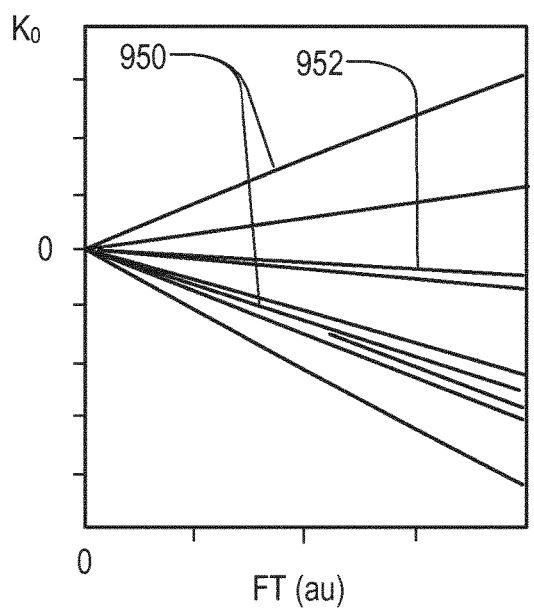
FIG. 16 illustrates the influence of feature asymmetry on measurements using different combinations of wavelength and polarization in the apparatus of FIG. 3.

FIG. 16 shows how the calculated value $K_0$ can be used as an indicator to select the best recipe (combination of wavelengths and polarization) for measuring overlay in the metrology apparatus. Again the horizontal axis represents floor tilt, while the vertical axis shows the value of $K_0$ calculated in step S6. Curves 950 show the calculated result for different recipes. The recipe represented by curve 952 has the lowest $K_0$ value and so is least sensitive to processing. This recipe is selected to make the most accurate overlay measurements. Note also that, compared with other target designs, overlay results, even in the presence of the undesired feature asymmetry, show less spread from wavelength to wavelength compared to the current 2-bias targets. Thus there is scope to base the recipe selection also on which recipe is most sensitive to overlay.

Figure 17:
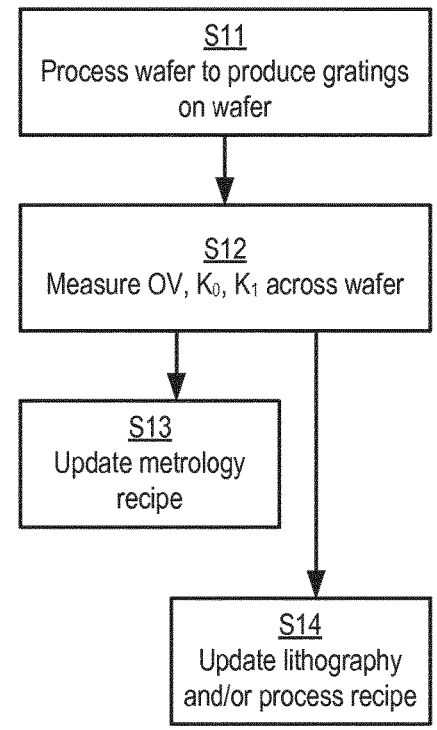
FIG. 17 illustrates a method of controlling performance of an inspection apparatus and/or lithographic process using the measurement of feature asymmetry.

FIG. 17 shows a flowchart illustrating a manufacturing process in which $K_0$ is used to monitor performance, and as a basis for controlling metrology and/or production processes. In step S11, wafers are processed to produce product features and metrology targets comprising overlay gratings having the novel bias schemes described above. At step S12, overlay and/or feature asymmetry ($K_0$) values are measured and calculated using the method of FIG. 6. At step S13, the measured $K_0$ is used (together with other information as may be available), to update a metrology recipe. The updated metrology recipe is used for re-measurement of overlay, and/or for measurement of overlay on subsequently processed wafers. In this way, so that calculated overlay measurements are improved in accuracy. The updating process can be automated if desired.

As mentioned, $K_0$ can also be used as an indicator for the presence and importance of the processing effects in general, not only with respect to the overlay measurement. Therefore it can be used as a so-called 'flagging function' in a production facility to indicate when processing effects are becoming significant for particular wafer. One can produce also maps of $K_0$ across a substrate, and can calculate relative value of $K_0/K_1$. In step S14, the knowledge of process asymmetry that is gained by calculation of $K_0$ is used to update recipes that control the lithographic patterning step and/or process steps in the device manufacturing process for re-work and/or for processing of further wafers. Again this updating can be automated if desired.

The calculated values of $K_1$ (and/or $K_1'$ and $K_1''$) can also be mapped to obtain information on symmetric variations in the stack across the wafer. The difference between $K_1'$ and $K_1''$ (either in absolute terms or in proportion) may tell something about how large the higher harmonics are in the stack, which may itself be used as a parameter to monitor performance in device production.

It will be appreciated that the 4-bias scheme requires more measurements and more targets than the known schemes. The additional measurements may impact throughput, if the composite target cannot fit entirely within the radiation spot. If this is of concern, metrology apparatus using a larger homogeneous illumination spot and a suitable target layout can be adopted, that allows for single-shot readout of all 4 gratings per direction in the target 900. If the spot is not larger than in FIGS. 3 and 4, then the target will be measured in two halves and measurement time will be increased, up to a factor of two. Both halves need the same recipe conditions (wavelength, polarization, exposure time, etc.), however, so there is no time penalty for wavelength switching/aperture switching). The worst case taking twice the time only arises if the measurement time is completely image-acquisition limited. If other steps are the rate-limiting steps, then the effect on throughput will be less. The target 900 occupies a greater "real estate", compared with the two-bias target of FIG. 4. However, the result is more robust to wafer-processing for a number of reasons.

Figure 18A:
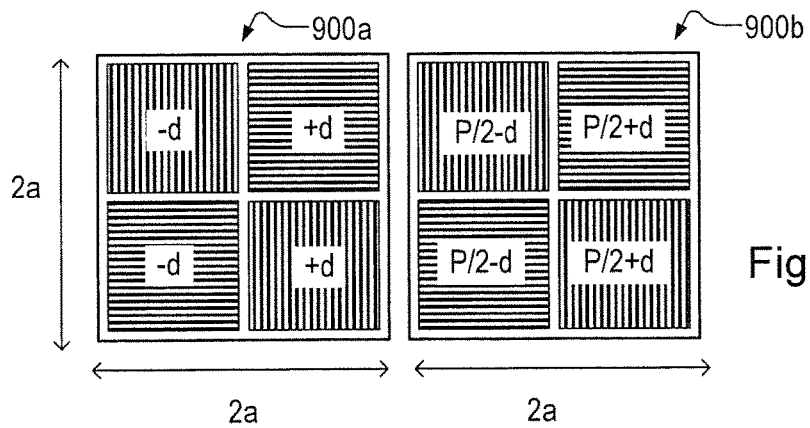
FIGS. 18(a)-18(c) illustrate three alternative designs of composite grating targets having the bias scheme of the second embodiment.
Figure 18B:
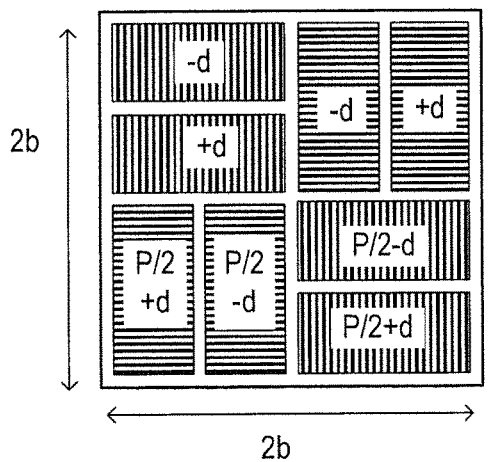
Figure 18C:
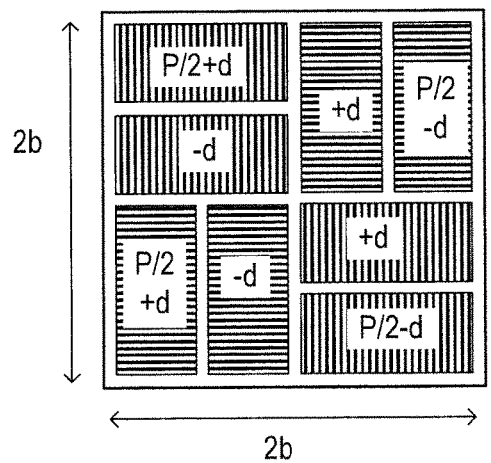

FIG. 18 shows some alternative designs of target, all based on the 4-bias scheme described with reference to FIG. 12. At (a) we see the configuration mentioned above, where two 4-grating targets 900a, 900b are formed in a conventional manner side by side. Each target 900a, 900b can be read in one shot by the scatterometer of FIG. 3. The unit dimension a may be for example 5 μm. At (b) and (c) we see alternative designs in which eight elongated targets are formed in four pairs, each pair occupying a square area. The bias values and directions of periodicity are indicated on the drawing in the same manner as before. The size of these targets may be based on a slightly larger unit size b, so that each elongated target may for example have a size 4×8 μm (b=8 μm). Provided the scatterometer can capture a dark field image of the entire square (2b×2b=16×16 μm) then the our biases in both X and Y directions can be measured in a single shot. Note that, where in a top layer of the grating there is a pair of elongate gratings with biased positions, to make the bottom layer one could simply form four square gratings with dimension b×b.

Furthermore, it is remarked that the technique disclosed here using three, four or more component gratings per overlay direction can be applied to large scatterometer targets, also referred to as standard targets, which are then modified to incorporate one or two additional biased gratings per overlay direction. Using the apparatus of FIG. 3, for example, the overlay in these larger targets can be measured by angle-resolved scatterometry using the pupil image sensor 19 instead of or in addition to measurements made in the dark-field imaging branch and sensor 23.

Implementation

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed. Further, pitch P of the metrology target is close to the resolution limit of the optical system of the scatterometer, but may be much larger than the dimension of typical product features made by lithographic process in the target portions C. In practice the lines and/or spaces of the overlay gratings may be made to include smaller structures similar in dimension to the product features.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified step S6 and so calculate overlay error or other parameters with reduced sensitivity to feature asymmetry.

The program may optionally be arranged to control the optical system, substrate support and the like to perform the steps S2-S5 for measurement of asymmetry on a suitable plurality of target structures. The program can update the metrology recipe for measurement of further substrates (S13). The program may be arranged to control (directly or indirectly) the lithographic apparatus for the patterning and processing of further substrates (step S14).

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a parameter of a lithographic process, the method comprising:
    (a) providing a plurality of target structures on a substrate, each target structure comprising overlaid periodic structures and each having a known overlay bias;
    (b) illuminating the targets and detecting radiation scattered by each target structure to obtain for that target structure a measurement representing an overall asymmetry that includes contributions due to (i) said known overlay bias, (ii) overlay performance of a lithographic process used to form the target structures and (iii) feature asymmetry within one or more of said periodic structures; and
    (c) using said overall asymmetry measurements for three or more target structures to calculate a measurement of said overlay error, said calculation being performed using the known overlay bias values and an assumed non-linear periodic relationship between overlay error and asymmetry, thereby to exclude the contribution due to feature asymmetry,
        wherein the known values of overlay bias for said three or more target structures include at least two values falling within a first region of said periodic relationship and at least one value falling within a second region of said periodic relationship, said periodic relationship in the first and second regions having gradients of opposite sign.

2. The method as claimed in claim 1, wherein the first region of said periodic relationship is a half period centered on zero bias and the second region is a half period centered on P/2 where P is the pitch of the periodic relationship.

3. The method as claimed in claim 1, wherein four or more different values of overlay bias are used and include at least two bias values within each of said first and second regions of the periodic relationship.

4. The method as claimed in claim 3, wherein in the step (c), said calculation is performed so as to allow said gradient to have different magnitudes in the first and second regions of the periodic relationship.

5. The method as claimed in claim 1, wherein at least four different values of overlay bias are used and comprise at least two bias values falling within the half period centered on zero bias and at least two bias values falling within a half period centered on P/2 where P is the pitch of the periodic relationship.

6. The method as claimed in claim 1, wherein said calculation is performed on the basis that said contribution due to feature asymmetry is constant for all values of overlay.

7. The method as claimed in claim 1, further comprising a step (d) of using a measure of said feature asymmetry obtained in step (c) to control the performance of step (b) in subsequent performances of the method.

8. The method as claimed in claim 7, further comprising a step (e) of using a measure of said feature asymmetry obtained in step (c) to control a lithographic process applied to another substrate.

9. The method as claimed in claim 1, further comprising a step (d) of using one or more gradient values obtained in step (c) to control the performance of step (b) in subsequent performances of the method.

10. The method as claimed in claim 9, further comprising a step (e) of using one or more gradient values obtained in step (c) to control a lithographic process applied to another substrate.

11. A substrate for use in a method according to claim 1, the substrate having a plurality of target structures formed thereon by a lithographic process, each target structure comprising overlaid periodic structures and each having a specific overlay bias, wherein the values of overlay bias for said three or more target structures include at least two values falling within a half period centered on zero bias and at least one value falling within a half period centered on P/2 where P is a period of said periodic structures.

12. A non-transitory computer program product comprising machine-readable instructions for causing a processor to perform the processing step (c) of a method of claim 1.

13. The non-transitory computer program product as claimed in claim 12, further comprising instructions for causing a processor to perform the step (d) of a method of claim 1.

14. A method of manufacturing devices wherein a device pattern is applied to a series of substrates using a lithographic process, the method including inspecting at least one periodic structure formed as part of or beside said device pattern on at least one of said substrates using an inspection method of claim 1 and controlling the lithographic process for later substrates in accordance with the result of the inspection method.

15. An inspection apparatus for measuring a parameter of a lithographic process, the apparatus comprising:
a support for a substrate having a plurality of target structures thereon, each target structure comprising overlaid periodic structures and each having a known overlay bias;
an optical system for illuminating the targets and detecting radiation scattered by each target structure to obtain for that target structure a measurement representing an overall asymmetry that includes contributions due to (i) said known overlay bias, (ii) overlay performance of said lithographic process and (iii) feature asymmetry within one or more of said periodic structures; and
a processor arranged to use said overall asymmetry measurements for three or more target structures having three or more different values of overlay bias to calculate a measurement of overlay performance, said calculation being performed using the known overlay bias values and an assumed non-linear relationship between overlay and target asymmetry, thereby to exclude the contribution due to feature asymmetry,
wherein the known values of overlay bias for said three or more target structures include at least two values falling within a first region of said periodic relationship and at least one value falling within a second region of said periodic relationship, said periodic relationship in the first and second regions having gradients of opposite sign.

16. The apparatus as claimed in claim 15, wherein at least four different values of overlay bias are used and comprise at least two bias values falling within the half period centered on zero bias and at least two bias values falling within a half period centered on P/2 where P is the pitch of the periodic relationship.

17. The apparatus as claimed in claim 15, wherein said processor is arranged to perform said calculation while allowing said gradient to have different magnitudes in the first and second regions of the periodic relationship.

18. The apparatus as claimed in claim 15, wherein said processor is arranged to perform said calculation on the basis that said contribution due to feature asymmetry is constant for all values of overlay.

19. The apparatus as claimed in claim 15, wherein said optical system includes an image sensor and is operable to capture radiation scattered from the different target structures simultaneously on different portions of said image sensor.

20. A lithographic system comprising:
a lithographic apparatus comprising:
an illumination optical system arranged to illuminate a pattern; and
a projection optical system arranged to project an image of the pattern onto a substrate; and
an inspection apparatus comprising:
a support for a substrate having a plurality of target structures thereon, each target structure comprising overlaid periodic structures and each having a known overlay bias;
an optical system for illuminating the targets and detecting radiation scattered by each target structure to obtain for that target structure a measurement representing an overall asymmetry that includes contributions due to (i) said known overlay bias, (ii) overlay performance of said lithographic process and (iii) feature asymmetry within one or more of said periodic structures; and
a processor arranged to use said overall asymmetry measurements for three or more target structures having three or more different values of overlay bias to calculate a measurement of overlay performance, said calculation being performed using the known overlay bias values and an assumed non-linear relationship between overlay and target asymmetry, thereby to exclude the contribution due to feature asymmetry,
wherein the known values of overlay bias for said three or more target structures include at least two values falling within a first region of said periodic relationship and at least one value falling within a second region of said periodic relationship, said periodic relationship in the first and second regions having gradients of opposite sign;
wherein the lithographic apparatus is arranged to use one or more parameters calculated by the inspection apparatus in applying the pattern to further substrates.

* * * * *